United States Patent
Lee et al.

(10) Patent No.: US 9,853,236 B2
(45) Date of Patent: Dec. 26, 2017

(54) POLARIZER AND DISPLAY DEVICE COMPRISING THE SAME

(71) Applicant: SAMSUNG DISPLAY CO., LTD., Yongin-si, Gyeonggi-do (KR)

(72) Inventors: Dukjin Lee, Suwon-si (KR); Junghee Son, Asan-si (KR); Woosuk Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 15/056,985

(22) Filed: Feb. 29, 2016

(65) Prior Publication Data

US 2016/0259104 A1    Sep. 8, 2016

(30) Foreign Application Priority Data

Mar. 2, 2015  (KR) .................. 10-2015-0029020

(51) Int. Cl.
*H01L 51/52* (2006.01)
*G02B 5/30* (2006.01)
*G02B 5/22* (2006.01)

(52) U.S. Cl.
CPC ............ *H01L 51/5237* (2013.01); *G02B 5/22* (2013.01); *G02B 5/3033* (2013.01); *G02B 5/3083* (2013.01); *H01L 51/5293* (2013.01)

(58) Field of Classification Search
CPC ...... G02B 5/22; G02B 5/3033; G02B 5/3083; H01L 51/5237
See application file for complete search history.

(56) References Cited

U.S. PATENT DOCUMENTS

| 8,390,187 | B2 |   | 3/2013 | Jung et al. |   |
|---|---|---|---|---|---|
| 8,628,202 | B2 | * | 1/2014 | Park | G02B 5/23 359/483.01 |
| 2010/0220388 | A1 | * | 9/2010 | Suzuki | B32B 17/10 359/359 |
| 2010/0320494 | A1 | * | 12/2010 | Kim | G02B 5/3033 257/98 |
| 2011/0204767 | A1 | * | 8/2011 | Jung | G02B 5/3025 313/498 |
| 2011/0228510 | A1 | * | 9/2011 | Park | G02B 5/23 362/19 |
| 2012/0256202 | A1 | * | 10/2012 | Lee | H01L 51/5256 257/88 |

(Continued)

FOREIGN PATENT DOCUMENTS

JP  WO 2016043166 A1 *  3/2016  .............. G02B 5/22
KR  10-2009-0005770 A     1/2009

(Continued)

*Primary Examiner* — Allan R Wilson
(74) *Attorney, Agent, or Firm* — Lewis Roca Rothgerber Christie LLP

(57) ABSTRACT

A polarizer includes: an adhesive layer including a binder resin and a light absorbing component dispersed in the binder resin, the light absorbing component including: a first light absorbing component to absorb a first light having a peak wavelength of about 430 nm or less; and a second light absorbing component to absorb a second light having a peak wavelength ranging from about 640 nm to about 720 nm; a phase retardation layer on the adhesive layer; and a linear polarizer on the phase retardation layer.

18 Claims, 4 Drawing Sheets

(56) References Cited

U.S. PATENT DOCUMENTS

2014/0285888 A1  9/2014 Tanaka et al.
2015/0076457 A1* 3/2015 Kwon ................ H01L 51/5237
                                                      257/40
2017/0017023 A1* 1/2017 Sugiyama ................ G02B 5/22

FOREIGN PATENT DOCUMENTS

| KR | 10-2011-0097045 A | 8/2011 |
| KR | 10-2013-0062572 A | 6/2013 |
| KR | 4-0069158 A | 6/2014 |

* cited by examiner

POLARIZER AND DISPLAY DEVICE COMPRISING THE SAME

CROSS-REFERENCE TO RELATED APPLICATION

This application claims priority to, and the benefit of, Korean Patent Application No. 10-2015-0029020, filed on Mar. 2, 2015, with the Korean Intellectual Property Office ("KIPO"), the disclosure of which is incorporated herein in its entirety by reference.

BACKGROUND

1. Field

One or more aspects of example embodiments of the present invention relate to a polarizer, and a display device including the polarizer.

2. Description of the Related Art

An organic light emitting diode ("OLED") display device is a self-emission-type display device that displays an image using an OLED for emitting light. Because a separate light source is not used, which is different from a liquid crystal display ("LCD") device, the OLED display device may be relatively thin and light-weight. Further, because of its excellent characteristics, such as low power consumption, high luminance, high response speed, and/or the like, the OLED display device has drawn attention as a next generation display device.

The OLED display device generally includes electrodes of the OLED and various metal wirings. The electrodes and metal wirings may reflect externally incident light (e.g., ambient light). Due to the reflection of externally incident light, the OLED display device may have difficulty representing a black color, and may exhibit a relatively low contrast ratio in a relatively bright environment.

To mitigate these issues, a polarizer for preventing external light reflection may be located on an OLED.

The above information disclosed in this Background section is for enhancement of understanding of the background of the invention, and therefore, it may contain information that does not constitute prior art.

SUMMARY

One or more aspects of example embodiments of the present invention are directed to a polarizer capable of absorbing visible light having short wavelengths and light having long wavelengths, and to a display device including the polarizer.

According to an exemplary embodiment of the present invention, a polarizer includes: an adhesive layer including a binder resin and a light absorbing component dispersed in the binder resin, the light absorbing component including: a first light absorbing component configured to absorb a first light having a peak wavelength of about 430 nm or less; and a second light absorbing component configured to absorb a second light having a peak wavelength ranging from about 640 nm to about 720 nm; a phase retardation layer on the adhesive layer; and a linear polarizer on the phase retardation layer.

The adhesive layer may have a light transmittance between about 50% to about 95%.

The phase retardation layer may include a quarter wave plate

The phase retardation layer may have a phase retardation value between about 130 nm to about 150 nm.

The phase retardation layer may include a cyclic olefin polymer (COP).

The polarizer may further include a support layer between the phase retardation layer and the linear polarizer.

The support layer may include a tri-acetyl cellulose (TAC) film.

The linear polarizer may include polyvinyl alcohol (PVA).

According to an exemplary embodiment of the present invention, a display device includes: a display panel having a display surface; and a polarizer on the display surface of the display panel, the polarizer including: an adhesive layer on the display panel, and including a binder resin and a light absorbing component dispersed in the binder resin, the light absorbing component including: a first light absorbing component configured to absorb a first light having a peak wavelength of about 430 nm or less; and a second light absorbing component configured to absorb a second light having a peak wavelength ranging from about 640 nm to about 720 nm; a phase retardation layer on the adhesive layer; and a linear polarizer on the phase retardation layer.

The adhesive layer may have a light transmittance between about 50% to about 95%.

The phase retardation layer may include a quarter wave plate.

The phase retardation layer may have a phase retardation value between about 130 nm to about 150 nm.

The phase retardation layer may include a COP.

The display device may further include a support layer between the phase retardation layer and the linear polarizer.

The support layer may include a tri-acetyl cellulose (TAC) film.

The linear polarizer may include polyvinyl alcohol (PVA).

The display panel may include: a first substrate; a first electrode on the first substrate; an organic light emitting layer on the first electrode; and a second electrode on the organic light emitting layer.

The display device may further include a thin film encapsulation layer on the second electrode, and including one or more organic layers and one or more inorganic layers that are alternately stacked.

The foregoing is illustrative only, and is not intended to be in any way limiting. In addition to the illustrative aspects and embodiments described above, further aspects and embodiments will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
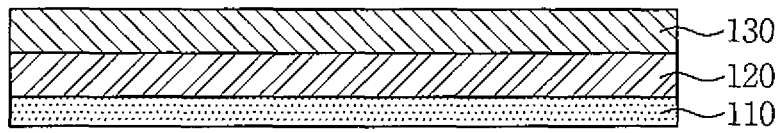
FIG. 1 is a cross-sectional view illustrating a polarizer according to a first exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a first exemplary embodiment of the present invention will be described with reference to FIG. 1.

FIG. 1 is a cross-sectional view illustrating a polarizer 101 according to a first exemplary embodiment of the present invention. The polarizer 101 includes an adhesive layer 110, a phase retardation layer 120 on the adhesive layer 110, and a linear polarizer 130 on the phase retardation layer 120.

The linear polarizer 130 is configured to linearly polarize external light incident to the polarizer 101.

The linear polarizer 130 may use a film that is formed by oriented adsorption of a dichroic pigment on a polyvinyl alcohol (PVA)-based resin.

Examples of the PVA-based resin may include a homopolymer of vinyl acetic acid or a copolymer of vinyl acetic acid and another monomer.

The linear polarizer 130 may be manufactured by uniaxially elongating a PVA resin film, dyeing the PVA resin film with a dichroic pigment for the dichroic pigment to be adsorbed to the PVA resin film in an absorption manner, treating the PVA resin film to which the dichroic pigment is adsorbed using a boron aqueous solution, and washing the PVA resin film. However, the method of manufacturing the linear polarizer 130 is not limited thereto.

The dichroic pigment may use, for example, iodine, and/or may use any suitable dichroic pigment. In a case where iodine is used as the dichroic pigment, the PVA resin film is immersed in an aqueous solution containing iodine and potassium iodine to be dyed, so that the linear polarizer 130 may be manufactured.

The thickness of the linear polarizer 130 may vary based on a product to which the linear polarizer 130 is to be applied. For example, the linear polarizer 130 may have a thickness ranging from about 5 micrometers (μm) to about 40 μm. The linear polarizer 130 may use a commercially available product.

The phase retardation layer 120 is located on a surface of the linear polarizer 130. The phase retardation layer 120 retards the phase of light. The phase retardation layer 120 may convert linearly polarized light into circularly polarized light, and/or may convert circularly polarized light to linearly polarized light. For example, external light incident to the polarizer 101 may be linearly polarized by the linear polarizer 130, and/or may be circularly polarized by the phase retardation layer 120. The circularly-polarized external light is reflected off a device to which the polarizer 101 is attached to form reflected light. During the process of reflection, the phase and polarization axis of the circularly-polarized external light may shift. The reflected light having the shifted phase may not be transmitted through the polarizer 101, thus, preventing or reducing the external light reflection by the polarizer 101.

A phase difference plate having a film shape may be used as the phase retardation layer 120. The phase difference plate may be formed through elongation of a film. For example, the phase difference plate may be formed by elongating a film including or being formed of a polymer, such as polycarbonate, polyvinyl alcohol, polystyrene, polymethyl methacrylate, polypropylene, polyolefin, polyarylate, and/or polyamide.

Further, a photo-curable liquid crystal may be used to manufacture the phase difference plate. For example, liquid crystals are aligned on a polymer-based film, and a liquid crystal pattern is formed thereon, so that the phase difference plate may be manufactured. The phase difference plate that is manufactured in such a manner may be a quarter wave plate QWP or a half wave plate HWP, based on an alignment layer and based on alignment of the liquid crystal material.

According to the first exemplary embodiment, the quarter wave plate QWP is used as the phase retardation plate 120. However, the present invention is not limited thereto, and in some embodiments, the half wave plate HWP may be used as the phase retardation plate 120, or the quarter wave plate QWP and the half wave plate HWP may be used together.

Further, the phase retardation layer 120 according to the first exemplary embodiment may include a cyclic olefin polymer (COP). For example, the phase retardation layer 120 may include a norbornene-based COP. The phase retardation layer 120 including the COP may have high light transmittance, high thermal-resistance, and/or high rigidity, but may have low moisture absorptivity. Further, the phase retardation layer 120 including the COP may have a relatively low manufacturing cost, and may exhibit a phase retardation value that is constant or substantially constant regardless of the wavelength of light transmitted through the phase retardation layer 120. Accordingly, the phase retardation layer 120 may be designed so that light having a wavelength "$\lambda$" in a wavelength range (e.g., a predetermined wavelength range) is phase-retarded by a quarter wavelength "$\lambda/4$," while the light is transmitted through the phase retardation layer 120. However, in a case where light transmitted through the phase retardation layer 120 has a wavelength outside the wavelength range, the phase of the light might not be retarded by a quarter of the wavelength thereof.

A center wavelength of visible light may correspond to a wavelength in a range of green light. Accordingly, the phase retardation layer 120 may retard a phase of green light by a quarter of the wavelength of the green light. For example, the phase retardation layer 120 may retard a phase of light having a wavelength ranging from about 520 nm to about 600 nm by a quarter of the wavelength thereof. More particularly, the phase retardation layer 120 may have a phase retardation value ranging from about 130 nm to about 150 nm. In such an embodiment, light transmitted through the phase retardation layer 120 may be phase-retarded by about 130 nm to about 150 nm.

The adhesive layer 110 is located on a surface of the phase retardation layer 120. The adhesive layer 110 absorbs light in a wavelength range of about 430 nm or less, and absorbs light in a wavelength range of about 640 nm to about 720 nm.

For example, the adhesive layer 110 includes a binder resin and a light absorbing component dispersed in the binder resin. The light absorbing component includes a first light absorbing component that absorbs a first light having a peak wavelength of about 430 nm or less, and a second light absorbing component that absorbs a second light having a peak wavelength ranging from about 640 nm to about 720 nm.

The first light absorbing component may absorb the first light having a blue-based color and having a peak wavelength of about 430 nm or less. Examples of the first light absorbing component may include a dye or a pigment that represents a yellow-based color. The second light absorbing component may absorb the second light having a red-based color and having a peak wavelength ranging from about 640 nm to about 720 nm. Examples of the second light absorbing component may include a dye or a pigment that represents a blue-green-based color. However, the first light absorbing component and the second light absorbing component are not limited thereto.

The first light absorbing component may include, for example, at least one from among anthraquinone-based dyes, methine-based dyes, azomethine-based dyes, oxadine-based dyes, azo-based dyes, styryl-based dyes, coumarin-based dyes, porphyrin-based dyes, dibenzofuranone-based dyes, diketopyrrolopyrrole-based dyes, rhodamine-based dyes, kisanten-based dyes, and pyrromethene-based dyes.

The second light absorbing component may include, for example, at least one from among anthraquinone-based dyes, methine-based dyes, azomethine-based dyes, oxadine-based dyes, azo-based dyes, styryl-based dyes, coumarin-based dyes, porphyrin-based dyes, dibenzofuranone-based dyes, diketopyrrolopyrrole-based dyes, rhodamine-based dyes, kisanten-based dyes, and pyrromethene-based dyes.

Although the first light absorbing component and the second light absorbing component may include dyes based on a same chemical compound, a wavelength for absorbing light may be different (e.g., vary) based on component and structure of each dye.

The adhesive layer 110 may include a light-transmissive resin in an amount of about 70 percent by weight (wt %) to about 99 wt %, and a light absorbing component in an amount of about 1 wt % to about 30 wt %, with respect to the total amount of the adhesive layer 110. An excessive amount of the light absorbing component may pose an impediment in manufacturing the adhesive layer 110, and may result in a decrease in light transmittance of the polarizer 101. On the other hand, an excessively small amount of the light absorbing component may lead to inadequate light absorption.

The adhesive layer 110 has a light transmittance ranging from about 50% to about 95%. In a case where the light transmittance of the adhesive layer 110 is less than about 50%, luminance of a device including the polarizer 101 may decrease. Further, in a case where the light transmittance of the adhesive layer 110 is more than about 95%, performance of the adhesive layer 110 to absorb the first light in a wavelength range of about 430 nm or less, and the second light in a wavelength range of about 640 nm to about 720 nm may be degraded.

The adhesive layer 110 may have a thickness ranging from about 50 nm to about 500 nm. In a case where the thickness of the adhesive layer 110 is less than about 50 nm, the adhesive layer 110 may not provide adequate adhesiveness and light absorption may be inadequately performed. On the other hand, in a case where the thickness of the adhesive layer 110 is more than about 500 nm, the polarizer 101 may have difficulty in achieving slimness.

The phase retardation layer 120 according to the first exemplary embodiment is designed to retard the phase of light having the green wavelength range by about a quarter of the wavelength thereof, thus being highly optimized in preventing or reducing reflection of external light having a green wavelength range. Accordingly, while the reflection of external light having the green wavelength range is efficiently prevented or reduced by the phase retardation layer 120, reflection of external light having a red wavelength range or a blue wavelength range may not be prevented or reduced adequately. As a result, in a case where a polarizer that only includes the phase retardation layer 120 and the linear polarizer 130 is used, purple-based light may be observed due to the reflection of external light.

The adhesive layer 110 of the polarizer 101 according to the first exemplary embodiment may absorb the first light having a peak wavelength of about 430 nm or less, and may absorb the second light having a peak wavelength ranging from about 640 nm to about 720 nm, so that external light having a red wavelength range and external light having a blue wavelength range that are incident to a device including the polarizer 101 may be suppressed from being reflected. Accordingly, purple-based light produced by reflection of external light may be prevented or substantially prevented from being observed in the display device, and performance of displaying a black color and contrast properties may be improved in a product to which the polarizer 101 is applied.

In some embodiments, the polarizer 101 may further include a release layer on another surface of the adhesive layer 110. The release layer protects the adhesive layer 110. The release layer may be removed before attaching the polarizer 101 to the display device.

Hereinafter, a second exemplary embodiment of the present invention will be described with reference to FIG. 2. Hereinafter, to avoid repetition, descriptions with respect to configurations described in the foregoing embodiment will be omitted.

Figure 2:
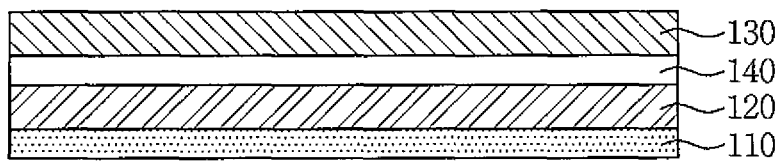
FIG. 2 is a cross-sectional view illustrating a polarizer according to a second exemplary embodiment.

FIG. 2 is a cross-sectional view illustrating a polarizer 102 according to the second exemplary embodiment.

The polarizer 102 according to the second exemplary embodiment further includes a support layer 140 between the phase retardation layer 120 and the linear polarizer 130. The support layer 140 is configured to support and protect the polarizer 102.

An example of the support layer 140 may include a tri-acetyl cellulose (TAG) film. The TAC film has an excellent device durability and mechanical strength.

Figure 3:
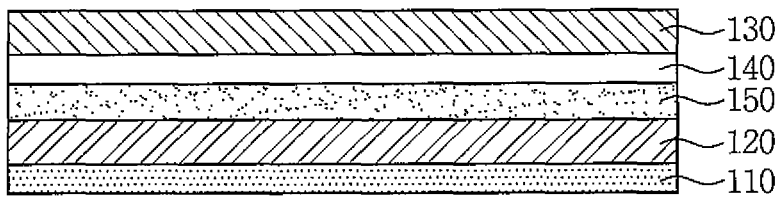
FIG. 3 is a cross-sectional view illustrating a polarizer according to a third exemplary embodiment.

Hereinafter, a third exemplary embodiment will be described with reference to FIG. 3. FIG. 3 is a cross-sectional view illustrating a polarizer 103 according to the third exemplary embodiment.

The polarizer 103 according to the third exemplary embodiment further includes an intermediate adhesive layer 150 between the phase retardation layer 120 and the support layer 140. The intermediate adhesive layer 150 connects (e.g., attaches) the phase retardation layer 120 to the support layer 140. Accordingly, the linear polarizer 130 and the phase retardation layer 120 are located (e.g., stably disposed) on opposite sides of the support layer 140, respectively.

The intermediate adhesive layer 150 may include or may be formed of the same or substantially the same material as that used for forming the adhesive layer 110. That is, the intermediate adhesive layer 150 may include a binder resin and a light absorbing component dispersed in the binder resin. In such an embodiment, the light absorbing component may include one of the first light absorbing component and the second light absorbing component, or may include both of the first light absorbing component and the second light absorbing component.

Figure 4:
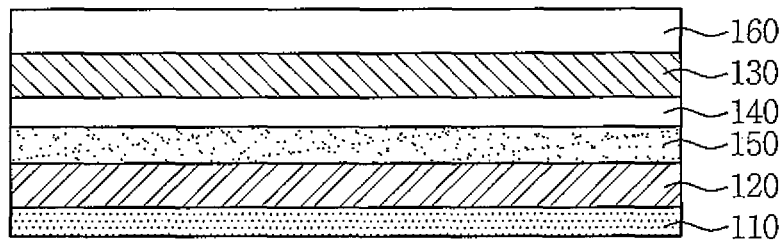
FIG. 4 is a cross-sectional view illustrating a polarizer according to a fourth exemplary embodiment.

Hereinafter, a fourth exemplary embodiment of the present invention will be described with reference to FIG. 4. FIG. 4 is a cross-sectional view illustrating a polarizer 104 according to the fourth exemplary embodiment.

The polarizer 104 according to the fourth exemplary embodiment further includes a protection layer 160 on the linear polarizer 130. The protection layer 160 is configured to protect the linear polarizer 130. A TAC film, which has an excellent mechanical strength, may be used as the protection layer 160. Further, a surface of the protection layer 160 may be treated to have anti-glare properties and anti-reflective properties.

Hereinafter, a fifth exemplary embodiment according to the present invention will be described with reference to FIGS. 5 and 6.

Figure 5:
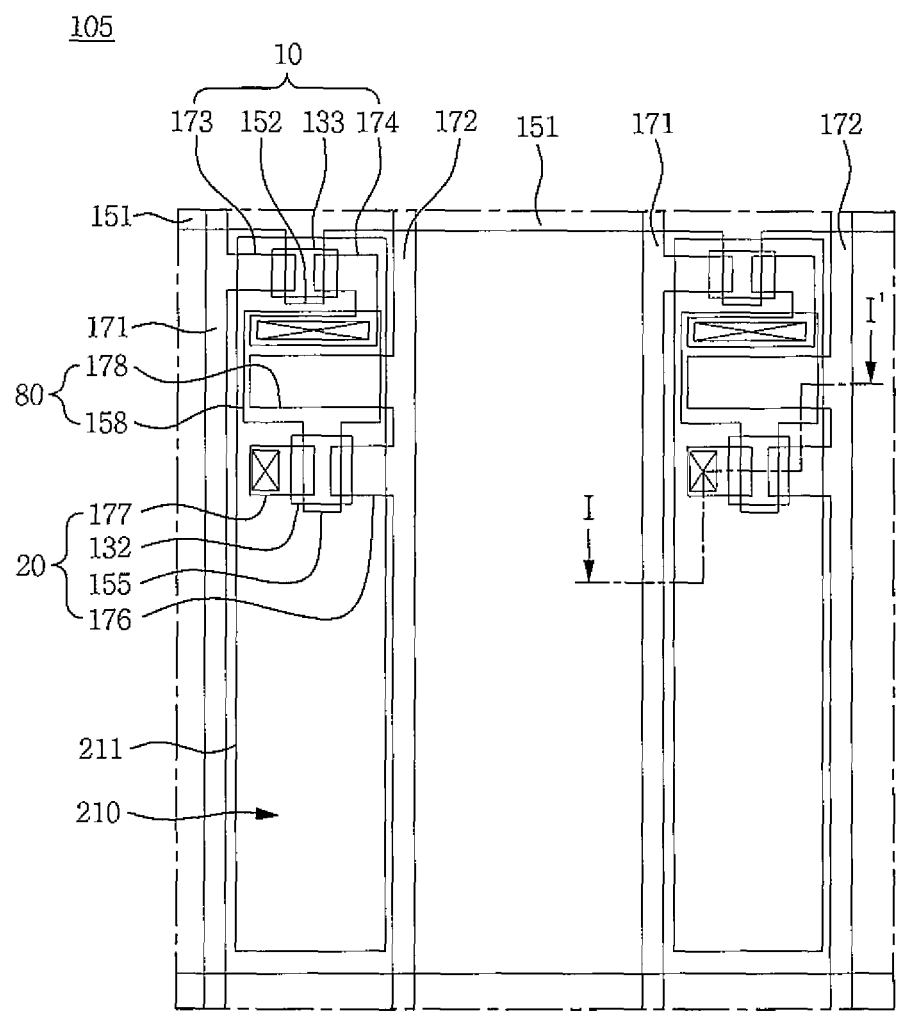
FIG. 5 is a plan view illustrating an organic light emitting diode ("OLED") display device according to a fifth exemplary embodiment.
Figure 6:
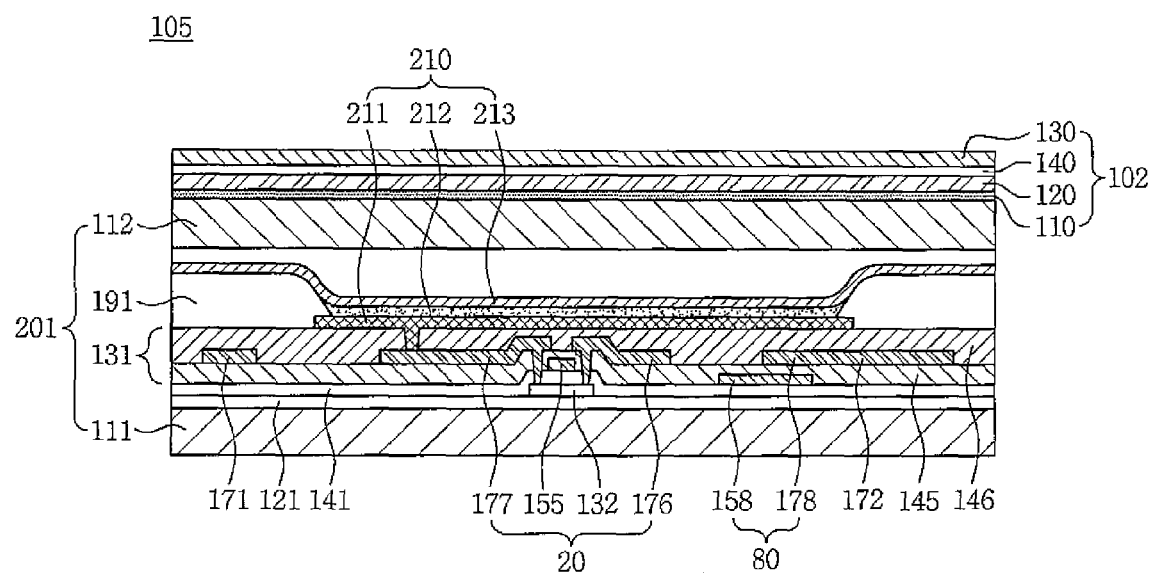
FIG. 6 is a cross-sectional view taken along the line I-I' of FIG. 5.

FIG. 5 is a plan view illustrating an organic light emitting diode ("OLED") display device 105 according to the fifth exemplary embodiment, and FIG. 6 is a cross-sectional view taken along the line I-I' of FIG. 5.

As illustrated in FIGS. 5 and 6, the OLED display device 105 according to the fifth exemplary embodiment includes a display panel 201 and a polarizer 102.

The display panel 201 includes a first substrate 111, a wiring unit 131, an OLED 210, and a second substrate 112.

The first substrate 111 may include, or may be formed of, an insulating material selected from among glass, quartz, ceramic, and plastic. However, the present invention is not limited thereto, and the first substrate 111 may include a metal material, such as stainless steel.

A buffer layer 121 is located on the first substrate 111. The buffer layer 121 may include one or more layers selected from various suitable inorganic layers and organic layers. The buffer layer 121 may reduce or effectively prevent infiltration of undesirable elements, such as moisture, into the wiring unit 131 and/or the OLED 210, and may also planarize a surface of the first substrate 111. However, in some embodiments, the buffer layer 121 may be omitted.

The wiring unit 131 is located on the buffer layer 121. The wiring unit 131 includes a switching thin film transistor ("TFT") 10, a driving TFT 20, and a capacitor 80. The wiring unit 131 may be used to drive the OLED 210. The OLED 210 may display an image by emitting light in response to a driving signal transmitted from the wiring unit 131.

FIGS. 5 and 6 illustrate an active matrix organic light emitting diode (AMOLED) display device 105 having a 2Tr-1 Cap (two transistors-one capacitor) structure in which a single pixel includes two thin film transistors (e.g., the switching TFT 10 and the driving TFT 20) and a single capacitor (e.g., the capacitor 80). However, the present invention is not limited thereto. For example, the OLED display device 105 may have various suitable structures in which a single pixel includes three or more TFTs and/or two or more capacitors, and an additional wiring may further be included. As used herein, the term "pixel" refers to a smallest unit for displaying an image, and the OLED display device 105 may display an image using a plurality of pixels.

The switching TFT 10, the driving TFT 20, the capacitor 80, and the OLED 210 are included in each pixel. In addition, a gate line 151, a data line 171 insulated from and crossing the gate line 151, and a common power line 172 are located in the wiring unit 131. A single pixel may be defined by a boundary defined by the gate line 151, the data line 171, and the common power line 172, but the present invention is not limited thereto. For example, the pixel may be defined by a pixel defining layer PDL or a black matrix.

The OLED 210 includes a first electrode 211, an organic light emitting layer 212 on the first electrode 211, and a second electrode 213 on the organic light emitting layer 212. Holes and electrons are injected from the first electrode 211 and the second electrode 213, respectively, into the organic light emitting layer 212 to be combined with each other to form excitons. The OLED 210 may emit light by energy generated when the excitons fall from an excited state to a ground state.

The capacitor 80 includes a pair of capacitor plates 158 and 178, with an insulating interlayer 145 between the capacitor plates 158 and 178. In this case, the insulating interlayer 145 may include a dielectric material. Capacitance of the capacitor 80 may be determined by an amount of electric charges accumulated in the capacitor 80 and a voltage across the capacitor plates 158 and 178.

The switching TFT 10 includes a switching semiconductor layer 133, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The switching semiconductor layer 133 and the driving semiconductor layer 132 are insulated from the switching gate electrode 152 and the driving gate electrode 155, respectively, by the gate insulating layer 141.

The switching TFT 10 is used as a switching element to select a pixel to perform light emission. The switching gate electrode 152 is connected to the gate line 151. The switching source electrode 173 is connected to the data line 171. The switching drain electrode 174 is spaced apart from the switching source electrode 173, and is connected to one of the capacitor plates, for example, the capacitor plate 158.

The driving TFT 20 applies, to the first electrode 211 of the OLED 210, a driving power for allowing the organic light emitting layer 212 of the OLED 210 of the pixel selected by the switching TFT 10, to perform light emission. The driving gate electrode 155 is connected to the capacitor plate 158, which is connected to the switching drain electrode 174. The driving source electrode 176 and the capacitor plate 178 are connected to the common power line 172. The driving drain electrode 177 is connected to the first electrode 211 of the OLED 210 through a contact hole.

According to the configuration described above, the switching TFT 10 is operated by a gate voltage applied to the gate line 151 to thereby transmit a data voltage applied to the data line 171 to the driving TFT 20. A voltage corresponding to a difference between a common voltage applied from the common power line 172 to the driving TFT 20 and a data voltage applied from the switching TFT 10 is stored in the capacitor 80. A current corresponding to the voltage stored in the capacitor 80 flows to the OLED 210 through the driving TFT 20, such that the OLED 210 may emit light.

In the fifth exemplary embodiment, the first electrode 211 is an anode that injects holes, and the second electrode 213 is a cathode that injects electrons. However, the present invention is not limited thereto, and various modifications may be made such that the first electrode 211 is a cathode, and the second electrode 213 is an anode.

A planarization layer 146 is located on the insulating interlayer 145. The planarization layer 146 may be formed of an insulating material, and may protect the wiring unit 131. The planarization layer 146 and the insulating interlayer 145 may be formed of the same or substantially the same material.

The drain electrode 177 of the driving TFT 20 is connected to the first electrode 211 of the OLED 210 through the contact hole formed in the planarization layer 146.

In the fifth exemplary embodiment, the first electrode 211 is a reflective electrode, and the second electrode 213 is a transflective electrode. Accordingly, light generated in the organic light emitting layer 212 may be transmitted through the second electrode 213 to be emitted. In other words, the OLED display device 105 according to the fifth exemplary embodiment may have a top-emission-type structure.

The reflective layer and the transflective layer may include one or more of magnesium (Mg), silver (Ag), gold (Au), calcium (Ca), lithium (Li), chromium (Cr), aluminum (Al), and copper (Cu), and/or an alloy thereof. In this regard, whether the electrode is a reflective type or a transflective type may be determined based on a thickness of the electrode. In general, the transflective layer has a thickness of about 200 nm or less. As the thickness of the transflective layer decreases, the light transmittance may increase, and as the thickness of the transflective layer increases, the light transmittance may decrease.

For example, the first electrode 211 may include a reflective layer including one or more of magnesium (Mg), silver (Ag), gold (Au), calcium (Ca), lithium (Li), chromium (Cr), aluminum (Al), and copper (Cu), and a transparent conductive layer on the reflective layer. Herein, the transparent conductive layer may include transparent conductive oxide (TCO), for example, one or more of indium tin oxide (ITO), indium zinc oxide (IZO), zinc oxide (ZnO), aluminum zinc oxide (AZO), and indium oxide ($In_2O_3$). Because the transparent conductive layer has a relatively high work function, hole injection through the first electrode 211 may be readily performed.

In addition, the first electrode 211 may have a triple-layer structure in which a transparent conductive layer, a reflective layer, and a transparent conductive layer are sequentially stacked.

The second electrode 213 may include a transflective layer including one or more of Mg, Ag, Au, Ca, Li, Cr, Al, and Cu.

At least one of a hole injection layer (HIL) and a hole transporting layer (HTL) may further be located between the first electrode 211 and the organic light emitting layer 212. In addition, at least one of an electron transporting layer (ETL) and an electron injection layer (EIL) may further be located between the organic light emitting layer 212 and the second electrode 213.

The organic light emitting layer 212, the HIL, the HTL, the ETL, and the EIL may be referred to collectively as an organic layer. The organic layer may be formed of a low molecular weight organic material or a high molecular weight organic material.

The pixel defining layer 191 may include an aperture. The aperture of the pixel defining layer 191 exposes a portion of the first electrode 211. The first electrode 211, the organic light emitting layer 212, and the second electrode 213 are sequentially stacked in the aperture of the pixel defining layer 191. The second electrode 213 may be located on the organic light emitting layer 212 as well as on the pixel defining layer 191. The OLED 210 generates light in the organic light emitting layer 212 in the aperture of the pixel defining layer 191. The pixel defining layer 191 may define a light emission area.

A capping layer may be located on the second electrode 213. The capping layer may protect the OLED 210.

The second substrate 112 is located on the OLED 210 to protect the OLED 210, and faces the first substrate 111. The second substrate 112 may be formed of the same or substantially the same material as that of the first substrate 111.

The polarizer 102 is located on the display panel 201 including the first substrate 111, the wiring unit 131, the OLED 210, and the second substrate 112. The polarizer 102 according to the fifth exemplary embodiment may have the same or substantially the same configuration as that of the polarizer 102 according to the second exemplary embodiment. The polarizer 102 is located on the second substrate 112, which corresponds to a display surface of the display panel 201. The adhesive layer 110 of the polarizer 102 is connected (e.g., attached) to the second substrate 112. Because description of the polarizer 102 is provided with reference to the second exemplary embodiment, repeat description thereof will be omitted.

Figure 7:
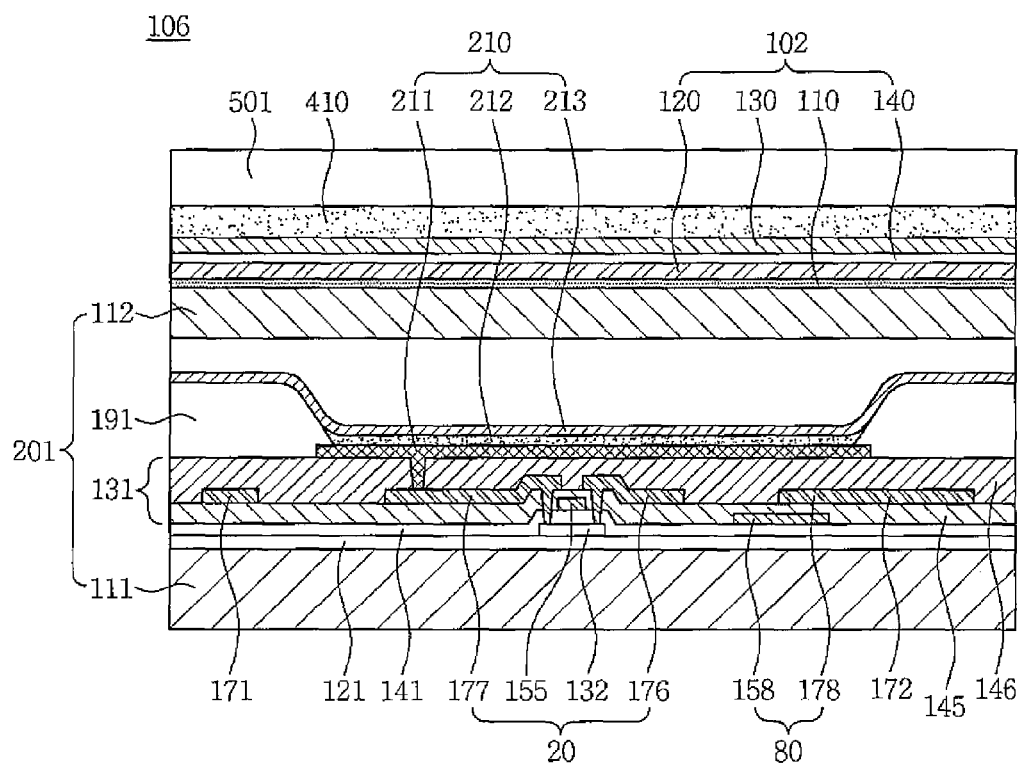
FIG. 7 is a cross-sectional view illustrating an OLED display device according to a sixth exemplary embodiment.

Hereinafter, a sixth exemplary embodiment of the present invention will be described with reference to FIG. 7. FIG. 7 is a cross-sectional view illustrating an OLED display device 106 according to the sixth exemplary embodiment of the present invention.

The OLED display device 106 according to the sixth exemplary embodiment further includes an adhesive resin layer 410 on the polarizer 102, and a window 501 on the adhesive resin layer 410. The adhesive resin layer 410 connects (e.g., attaches) the window 501 to the polarizer 102.

Figure 8:
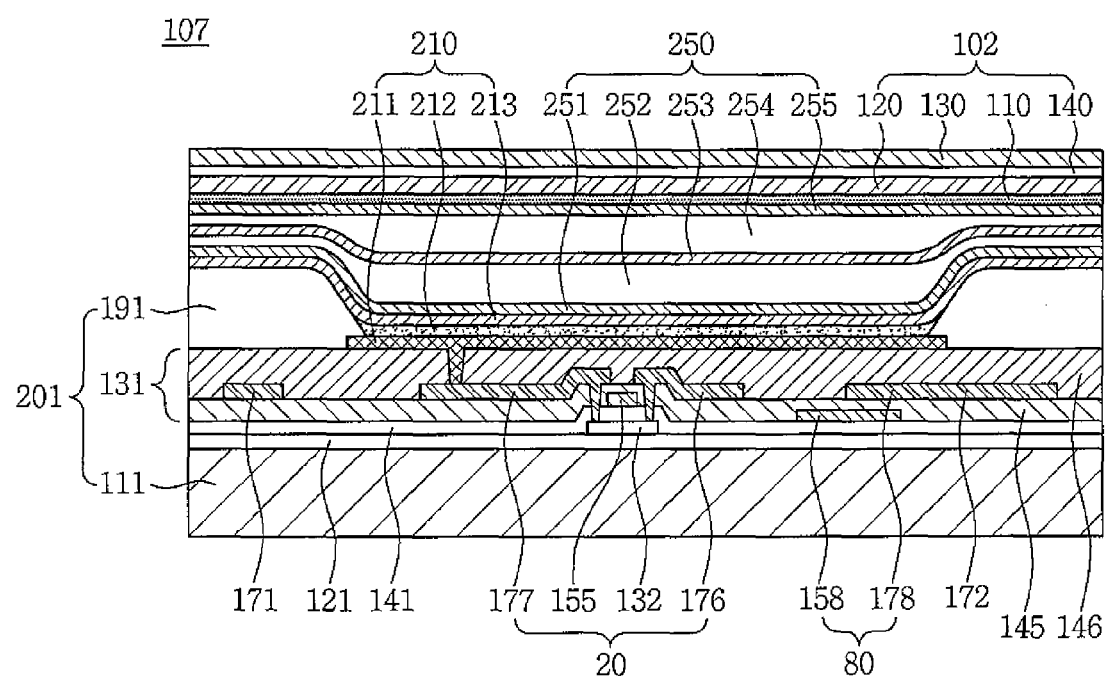
FIG. 8 is a cross-sectional view illustrating an OLED display device according to a seventh exemplary embodiment.

Hereinafter, a seventh exemplary embodiment of the present invention will be described with reference to FIG. 8. FIG. 8 is a cross-sectional view illustrating an OLED display device 107 according to the seventh exemplary embodiment.

The OLED display device 107 according to the seventh exemplary embodiment further includes a thin film encapsulation layer 250 on the OLED 210.

The thin film encapsulation layer 250 includes one or more inorganic layers 251, 253, and 255 and one or more organic layers 252 and 254. The thin film encapsulation layer 250 has a structure in which the inorganic layers 251, 253, and 255 and the organic layers 252 and 254 are alternately stacked. In this case, the inorganic layer 251 may be a lowermost layer of the stacked structure of the thin film encapsulation layer 250. In other words, the inorganic layer 251 may be most adjacent to the OLED 210 from among the layers 251, 252, 253, 254, and 255 of the thin film encapsulation layer 250. Although FIG. 8 illustrates the thin film encapsulation layer 250 as including the three inorganic layers 251, 253, and 255 and the two organic layers 252 and 254, the present invention is not limited thereto.

The inorganic layers 251, 253, and 255 may include one or more of $Al_2O_3$, $TiO_2$, ZrO, $SiO_2$, AlON, AlN, SiON, $Si_3N4$, ZnO, and $Ta_2O_5$. The inorganic layers 251, 253, and 255 may be formed through a chemical vapor deposition (CVD) process, or an atomic layer deposition (ALD) process. However, the present invention is not limited thereto, and the inorganic layers 251, 253, and 255 may be formed through various suitable processes known in the pertinent art.

The organic layers 252 and 254 may include, or may be formed of, a polymer-based material. Examples of the polymer-based material may include an acrylic resin, an epoxy resin, polyimide, polyethylene, and/or the like. The organic layers 252 and 254 may be formed through a thermal deposition process. The thermal deposition process for forming the organic layers 252 and 254 may be performed in a range of a temperature in which the OLED 210 is not damaged. However, the present invention is not limited thereto, and the organic layers 252 and 254 may be formed through various suitable processes known in the pertinent art.

The inorganic layers 251, 253, and 255 may be formed to have a high density of a thin film, and may serve to reduce or effectively prevent infiltration of moisture or oxygen. The infiltration of moisture or oxygen into the OLED 210 may be prevented or substantially prevented by the inorganic layers 251, 253, and 255.

Moisture or oxygen passing through the inorganic layers 251, 253, and 255 may be blocked further by the organic layers 252 and 254. The organic layers 252 and 254 may exhibit relatively low efficiency in preventing the moisture infiltration, as compared to the inorganic layers 251, 253, and 255. However, the organic layers 252 and 254 may also serve as a buffer layer to reduce stress between respective layers of the inorganic layers 251, 253, and 255 and the organic layers 252 and 254, in addition to the prevention of the moisture infiltration. Further, because the organic layers 252 and 254 have a planarization property, an uppermost surface of the thin film encapsulation layer 250 may be planarized.

The thin film encapsulation layer 250 may have a thickness of about 10 μm or less. Accordingly, an overall thickness of the OLED display device 102 may be reduced or significantly reduced.

When the thin film encapsulation layer 250 is located on the OLED 210, the second substrate 112 may be omitted. When the second substrate 112 is omitted, a flexible property of the OLED display device 102 may be enhanced.

The polarizer 102 is located on the thin film encapsulation layer 250. The polarizer 102 according to the second exemplary embodiment may be used as the polarizer 102 according to the seventh exemplary embodiment.

As described above, according to one or more exemplary embodiments, a polarizer includes an adhesive layer capable of absorbing light having a long wavelength and visible light having a short wavelength, and thus, may have excellent characteristics in preventing or reducing external light reflection.

From the foregoing, it will be appreciated that various embodiments in accordance with the present invention have been described herein for purposes of illustration, and that various modifications may be made thereof without departing from the scope and spirit of the present invention. Accordingly, various features of the above described and other embodiments can be mixed and matched in any suitable manner, to produce further embodiments consistent with the invention. Further, the various embodiments dis-

What is claimed is:

1. A polarizer comprising:
    an adhesive layer comprising a binder resin and a light absorbing component dispersed in the binder resin, the light absorbing component comprising:
        a first light absorbing component configured to absorb a first light having a peak wavelength of about 430 nm or less; and
        a second light absorbing component configured to absorb a second light having a peak wavelength ranging from about 640 nm to about 720 nm;
    a phase retardation layer on the adhesive layer; and
    a linear polarizer on the phase retardation layer,
    wherein the phase retardation layer retards a phase of light having a wavelength ranging from about 520 nm to about 600 nm by a quarter of the wavelength thereof.

2. The polarizer of claim 1, wherein the adhesive layer has a light transmittance between about 50% to about 95%.

3. The polarizer of claim 1, wherein the phase retardation layer comprises a quarter wave plate.

4. The polarizer of claim 1, wherein the phase retardation layer has a phase retardation value between about 130 nm to about 150 nm.

5. The polarizer of claim 1, wherein the phase retardation layer comprises a cyclic olefin polymer (COP).

6. The polarizer of claim 1, further comprising a support layer between the phase retardation layer and the linear polarizer.

7. The polarizer of claim 6, wherein the support layer comprises a tri-acetyl cellulose (TAC) film.

8. The polarizer of claim 1, wherein the linear polarizer comprises polyvinyl alcohol (PVA).

9. A display device comprising:
    a display panel having a display surface; and
    a polarizer on the display surface of the display panel, the polarizer comprising:
        an adhesive layer on the display panel, and comprising a binder resin and a light absorbing component dispersed in the binder resin, the light absorbing component comprising:
            a first light absorbing component configured to absorb a first light having a peak wavelength of about 430 nm or less; and
            a second light absorbing component configured to absorb a second light having a peak wavelength ranging from about 640 nm to about 720 nm;
        a phase retardation layer on the adhesive layer; and
        a linear polarizer on the phase retardation layer,
    wherein the phase retardation layer retards a phase of light having a wavelength ranging from about 520 nm to about 600 nm by a quarter of the wavelength thereof.

10. The display device of claim 9, wherein the adhesive layer has a light transmittance between about 50% to about 95%.

11. The display device of claim 9, wherein the phase retardation layer comprises a quarter wave plate.

12. The display device of claim 9, wherein the phase retardation layer has a phase retardation value between about 130 nm to about 150 nm.

13. The display device of claim 9, wherein the phase retardation layer comprises a COP.

14. The display device of claim 9, further comprising a support layer between the phase retardation layer and the linear polarizer.

15. The display device of claim 14, wherein the support layer comprises a tri-acetyl cellulose (TAC) film.

16. The display device of claim 9, wherein the linear polarizer comprises polyvinyl alcohol (PVA).

17. The display device of claim 9, wherein the display panel comprises:
    a first substrate;
    a first electrode on the first substrate;
    an organic light emitting layer on the first electrode; and
    a second electrode on the organic light emitting layer.

18. A display device comprising:
    a display panel having a display surface, the display panel comprising:
        a first substrate;
        a first electrode on the first substrate;
        an organic light emitting layer on the first electrode; and
        a second electrode on the organic light emitting layer;
    a polarizer on the display surface of the display panel, the polarizer comprising:
        an adhesive layer on the display panel, and comprising a binder resin and a light absorbing component dispersed in the binder resin, the light absorbing component comprising:
            a first light absorbing component configured to absorb a first light having a peak wavelength of about 430 nm or less; and
            a second light absorbing component configured to absorb a second light having a peak wavelength ranging from about 640 nm to about 720 nm;
        a phase retardation layer on the adhesive layer; and
        a linear polarizer on the phase retardation layer; and
    a thin film encapsulation layer on the second electrode, and comprising one or more organic layers and one or more inorganic layers that are alternately stacked.

* * * * *